Figure 1:
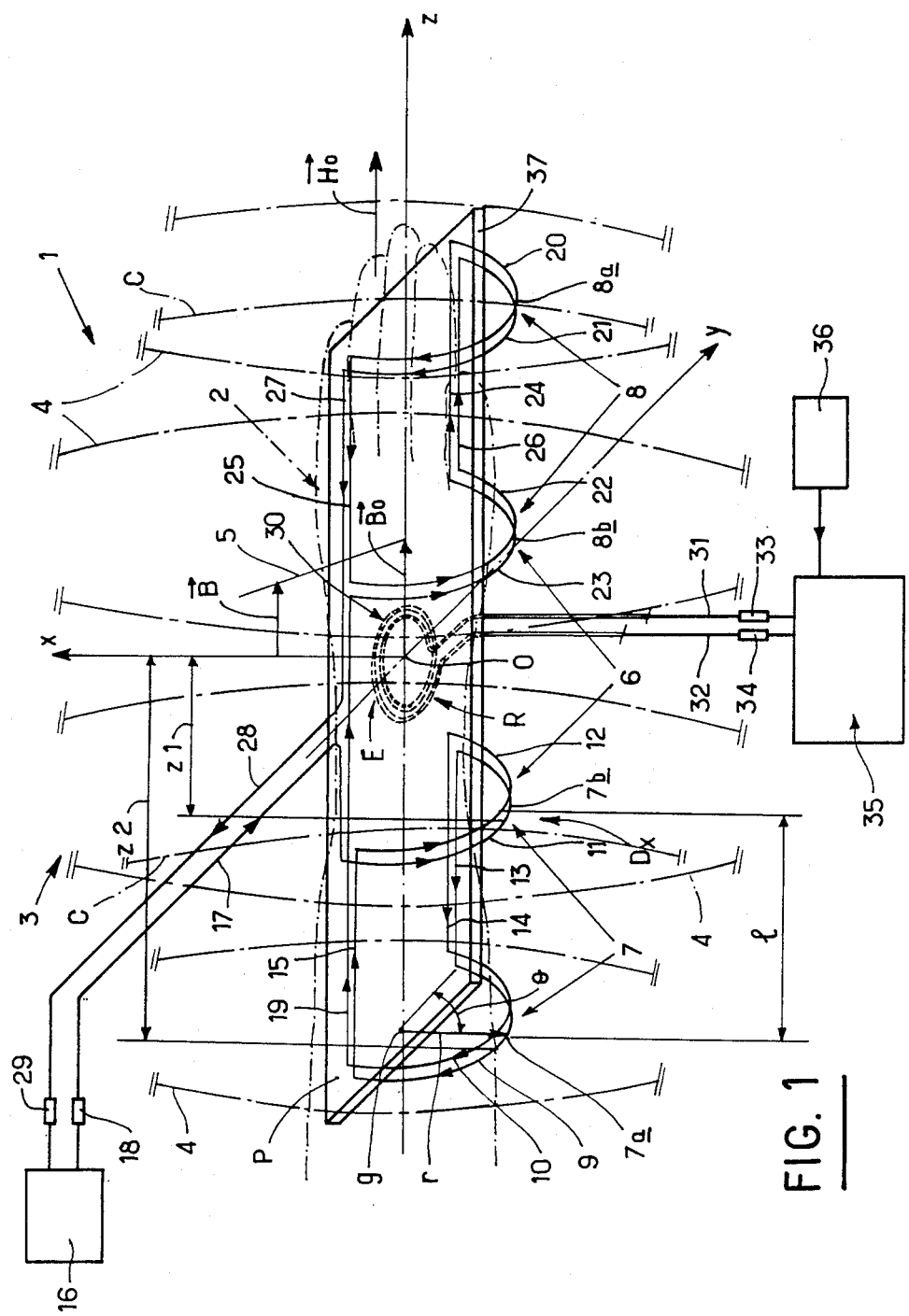

United States Patent [19]

Yassine et al.

[11] Patent Number: 4,870,363

[45] Date of Patent: Sep. 26, 1989

[54] APPARATUS FOR CREATING A MAGNETIC FIELD GRADIENT AND THE EXAMINATION OF A SURFACE LAYER OF A BODY

[75] Inventors: Mohamed M. Yassine, Les Ulis; Bernard Querleux, Paris; Luc Darrasse, Paris; Hervé Saint Jalmes, Paris; Jacques Taquin, Bures Sur Yvette; Michel Sauzade, Palaiseau; Jean-Luc Levéque, Le Raincy, all of France

[73] Assignee: L'Oreal, Paris, France

[21] Appl. No.: 29,016

[22] Filed: Mar. 23, 1987

[30] Foreign Application Priority Data

Mar. 19, 1987 [FR] France .................. 87 03798

[51] Int. Cl.$^4$ ............................. G01R 33/20
[52] U.S. Cl. ............................. 324/318; 128/653
[58] Field of Search ............... 324/318, 319, 320, 300, 324/307; 335/209, 299; 128/653

[56] References Cited

U.S. PATENT DOCUMENTS

| 4,315,216 | 2/1982 | Clow et al. ............ 324/309 |
| 4,636,728 | 1/1987 | Compton et al. ........ 324/318 |
| 4,727,328 | 2/1988 | Carper et al. ......... 324/318 |

FOREIGN PATENT DOCUMENTS 0171741 2/1986 European Pat. Off. .
0176353 4/1986 European Pat. Off. .
0186998 7/1986 European Pat. Off. .
0187389 7/1986 European Pat. Off. .
0232189 8/1987 European Pat. Off. .
2052069 1/1981 United Kingdom .
2137756 10/1984 United Kingdom .
2137757 10/1984 United Kingdom .

*Primary Examiner*—Stewart J. Levy
*Assistant Examiner*—Kevin D. O'Shea
*Attorney, Agent, or Firm*—Cushman, Darby & Cushman

[57] ABSTRACT

The apparatus (1) is constituted by: device (3) for creating a homogeneous main magnetic static field (HO) orientated along a determined direction (Oz) in which static field there is placed the body (2) to be examined; devices for creating magnetic field gradients in a space of the body to be examined along three directions of the space; radio frequency excitation device (E) and a device (R) for the detection of the nuclear magnetic resonance signals produced by the body to be examined. The one, (Dx) of the devices for creating the gradients is constituted by a unilateral system wherein the device (6) for creating the magnetic field gradient along one direction (Ox) of the space are entirely situated on one and the same side of an "open" surface (P) while the body to be examined (2) is situated on the side of the surface (P) which is opposite to that where the device (6) is located, which are capable of creating a transverse gradient in relation to the direction (Oz) of the main static field, on the side of the surface where the body (2) to be examined is situated. Such a device (Dx) is particularly suitable for NMR imaging of the human skin.

14 Claims, 2 Drawing Sheets

APPARATUS FOR CREATING A MAGNETIC FIELD GRADIENT AND THE EXAMINATION OF A SURFACE LAYER OF A BODY

The invention relates to an apparatus for the examination of a body (or object) by nuclear magnetic resonance (NMR) by slow and fast methods of the kind comprising: means for creating a main homogeneous static magnetic field, orientated along a determined direction, into which static field the body is placed; devices for creating magnetic field gradients along three directions of the space in a volume of the body to be examined; radio frequency excitation means and signals for the detection of the nuclear magnetic resonance produced by the body to be examined.

The invention concerns more particularly, but not exclusively, an apparatus for the examination of the surface layer of the body because it seems that in this case it should be most worthwhile, and more particularly for the examination of the skin of the human body with a view to obtaining an imaging of the skin by NMR.

It is known that an imaging apparatus by nuclear magnetic resonance makes it possible to obtain images of the interior of the human body with a resolution of the order of a millimeter. The spatial localization in the volume to be investigated of the body is obtained by the superposition of the magnetic field gradients on the main static field whose direction is generally marked by the z axis.

In the NMR imaging apparatuses known hitherto, the devices for creating the magnetic field gradients along three directions of space generally have a cylindrical shape whose dimensions are adequate to allow access of the whole body, in particular of the human body, to the interior of these devices. Such apparatuses permit examination of the zones situated at any point of the body and all that is necessary is to place it suitably in the apparatus for the examination to aim at the required zone. It may therefore be said that these apparatuses allow the "whole body" to be examined which represents an important advantage.

However, because of the large geometrical dimensions of these devices (generally formed by electromagnetic coils) intended to create magnetic field gradients, the amounts of electric power used are considerable. By way of indication, the electric power necessary for establishing a gradient of a given intensity is substantially proportional to the power of 5 of the dimension (generally the diameter) of the electromagnetic coil intended to create the gradient.

Now it is desirable in order to improve the image resolution, particularly in the case of surface imaging, to obtain a high gradient intensity and/or a short switching time (or establishment time of the gradient). Because of the large geometrical dimensions of the coils referred to above, such an improvement in resolution would require prohibitive electric power. One could envisage a reduction of the dimensions (diameter) of the gradient coils but then the access of the body to the interior of these coils would become difficult, or the apparatus would be limited to an examination of only certain parts of the body and would no longer allow an examination of the entire body.

This, then, is an important drawback of the apparatuses of the prior art.

The object of the invention is above all to provide an apparatus for the examination of a body by nuclear magnetic resonance, in particular for the examination of the surface layer of this body which would meet the various practical requirements better than heretofore and which would in particular, no longer, have the drawback referred to above. It is in particular, desirable for the apparatus in accordance with the invention to offer good access to the space to be investigated and which would make it possible to obtain a high spatial resolution without thereby requiring a considerable increase of the electric power supply of the device intended to create the magnetic field gradients. This apparatus should, moreover, allow the whole body to be examined.

In accordance with the invention, an apparatus for the examination of a body by nuclear magnetic resonance (NMR) in particular, for an examination of the surface layer of this body, is characterized in that at least one of the devices for creating the gradients is constituent by a unilateral system wherein the means for creating the magnetic field gradient along one spatial direction are entirely situated on the same side of an "open" surface, whilst the body to be investigated is placed on the opposite side of this surface to that where the above mentioned means are located which are capable of creating at least one transverse gradient in relation to the direction of the main static field on the side of the surface where the body to be investigated is situated.

By "open" surface, a surface is designated whereon no closed contour can be found capable of completely surrounding the body or the part of the body to be examined when the latter is in position. Thus the body, or part of the body to be examined is not introduced into the unilateral system but is placed against it.

Such an "open" surface can be simply obtained in the form of a plane. Other surface types are possible such as concave surfaces on the side of the body with a transverse cross section of an arc of a curve or surfaces adapted to the shape of the body or part of the body to be examined.

The means for creating the magnetic field gradient are advantageously constituted by a coil comprising two windings symmetrical with respect to each other in relation to a plane orthogonal to the direction of the main static field; these two windings may be connected in series or in parallel.

Preferably, each winding comprises at least two arcs or groups of turn arcs situated in a plane orthogonal to the direction of the main static field and interspaced from each other along this direction, these turn arcs being interconnected.

Each turn arc situated in a plane orthogonal to the direction of the static field has a half angle of opening chosen to maximize the term $\partial Bz/\partial x$ in the expansion of the field created by this turn arc; this half angle of the opening may be equal to $\pi/2$.

The detection means may comprise a flat reception coil disposed in a plane parallel to the direction of the static field and orthogonal to the direction of the gradient created by the device. This reception coil is, in particular, situated at the center of the device.

The apparatus does advantageously comprise means for producing a frequency translation of the spectrometer during reception of the NMR signal with a view to correcting the frequency displacement due to the field created by the gradient coil at the level of the reception coil.

The unilateral system for creating the magnetic field gradient can comprise a supporting plate whereon there is fixed on the one side the gradient coil, provision being made for electric connection means for the gradient coil to facilitate the assembly and dismantling of the device, the body to be examined being applied against the supporting plate on the opposite side to the gradient coil. The unilateral system can also comprise a flat reception coil fixed on the supporting plate on the same side as the gradient coil, provision also being made for electric connection means for this reception coil.

The invention also relates to the (unilateral system) device for creating a magnetic field gradient, it being possible for this device to constitute a separate subassembly, capable of being combined with an examination apparatus by nuclear magnetic resonance.

Such a device for creating a magnetic field gradient in an apparatus for the examination of a body or part of a body by nuclear magnetic resonance is characterized in that it comprises a plate made of a material not producing any, or few, nuclear magnetic resonance signals, made in particular of a translucent plastic material, the gradient coil being fixed on one side of this plate, the body or object to be examined being intended to be applied against the plate on the opposite side to the gradient coil.

The gradient coil comprises two windings symmetrical with respect to each other in relation to a plane orthogonal to the plate and its large dimension, these two windings being connected in series or in parallel.

The reception coil may also be fixed on the plate, on the same side as the gradient coil, in particular at the center of the latter.

Apart from the arrangements set out above, the invention consists of a certain number of other arrangements which will be discussed in greater detail below in relation to a particular mode of embodiment described with reference to the attached drawing but which is in no way restrictive.

FIG. 1 of these drawings is a schematic view in perspective of an apparatus in accordance with the invention.

Figure 2:
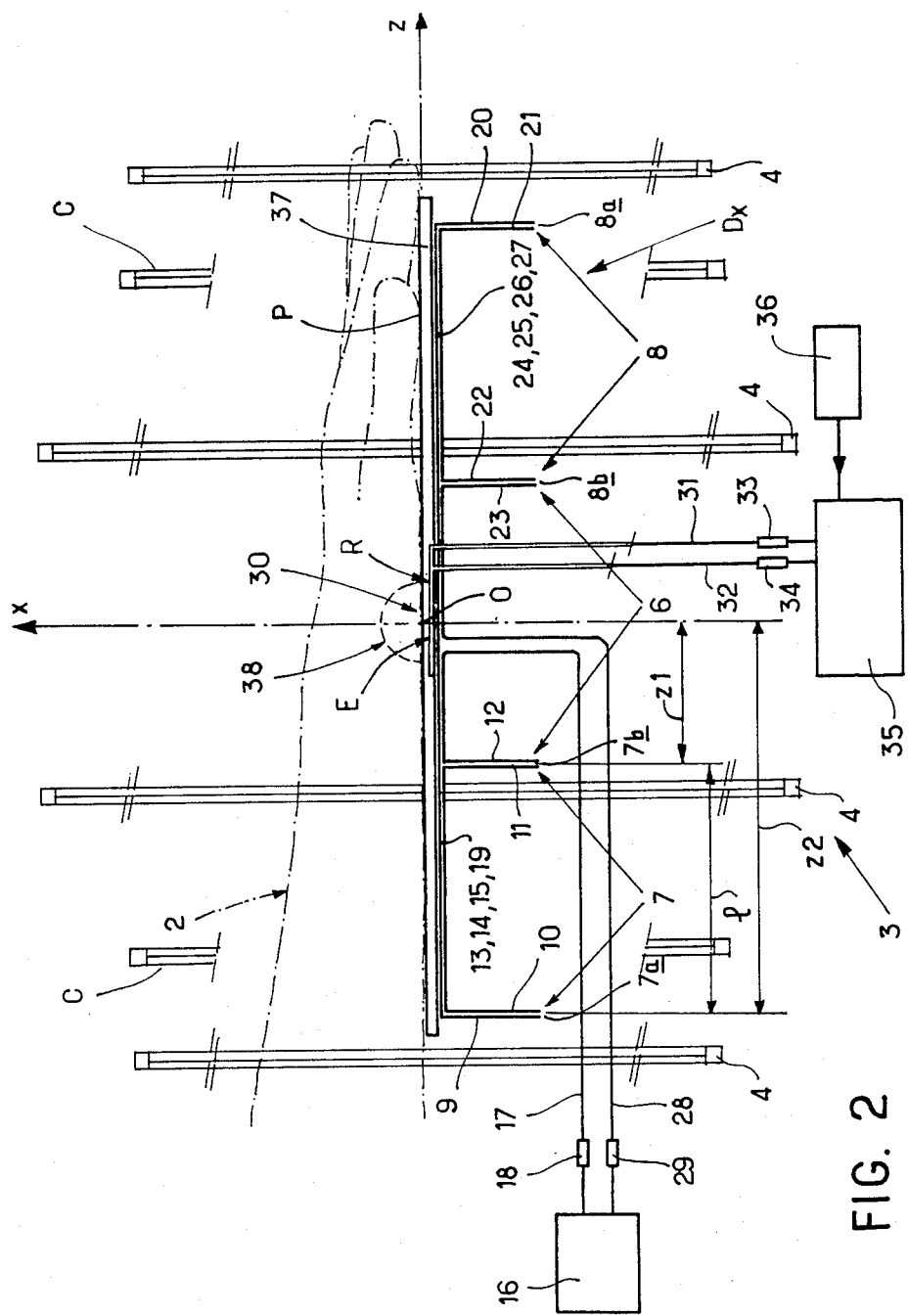

FIG. 2, finally, is an elevational view, with cut parts, of the apparatus of FIG. 1.

Referring to the drawings and FIG. 1 in particular, an apparatus 1 may be seen for the examination of a body or of an object by nuclear magnetic resonance (NMR), in particular for examining the surface layer of this body or of this object.

In the example of use represented in the drawings, the apparatus 1 serves for the examination in vivo of the skin of the human body; more particularly the drawing represents a forearm 2 of a person (not shown), a zone of whose skin is subjected to examination by NMR.

The apparatus 1 comprises means 3 for creating a main static magnetic field H0, as homogeneous as possible, schematically outlined by an arrow on FIG. 1 and orientated along direction Oz. The means 3 are constituted by a group of schematically represented electromagnetic coils 4, distributed along the direction Oz, these coils 4 having a closed, generally circular contour whose median plane is orthogonal to the axis Oz, the said coils 4 being centered on this axis Oz.

The body or object to be examined by NMR, in the present case the forearm 2, is introduced into the internal volume of the coils 4 so as to be placed in the static field H0.

Provision is made for devices Dx, Dy, Dz for creating magnetic field gradients along three spatial directions Ox, Oy, Oz, in particular orthogonal ones, in a volume of the body to be examined, the point O being situated at the center of the coils.

The devices Dx, Dy for creating the transverse gradients Gx, Gy along directions parallel to Ox and Oy can be constituted by an assembly of semi-circular turn arcs situated in a plane perpendicular to the main field H0 directed along Oz. The turn arcs of the device Dy are angularly offset by a suitable value in relation to those of the device Dx. The turn arc of the devices Dy and Dz have not been represented in FIG. 1 where only the portions of circles C, whereon the median lines of these arcs are situated, have been shown in dots and dashed. Provision is also made for radio frequency excitation means E and means R for the detection of the nuclear magnetic resonance signals produced by the body 2 to be examined. The excitation means E and the detection means R can be constituted by one and the same coil, as in the case represented in FIG. 1 or by different coils.

Numerous articles, works and communications have explained the nuclear magnetic resonance principles in detail, deriving from the fact that certain nuclei and more particularly the protons (hydrogen nuclei) have spins equivalent to magnetic dipoles, which can be orientated when they are placed into an external magnetic field. These nuclei, after having been excited by a radiofrequency coil, produces signals received by detection means R. The field gradients are intended to make it possible to localize the nuclei whence the signals originate in space (see, for instance, the article "NMR imaging techniques and applications: A review" by Paul A. BOTTOMLEY in Rev. Sic. Instrum., vol. 53 (No. 9), September, 1982 pp 1319 to 1337).

The device Dx for creating the magnetic field gradient along the Ox direction is constituted by a unilateral system wherein the means 6 for creating the field gradient are entirely situated on one and the same side of an "open" surface P, whilst the body to be examined is situated on the side of this surface P which is opposite that where the above mentioned means 6 are situated.

The surface P can be constituted by a plane as represented in the drawings, or by other surfaces, notably concave ones on the side of the body 2. The surface P can be adapted to the portion of the body 2 to be examined.

As explained above, by "open surface" one designates a surface whereon no closed contour completely surrounding the body 2 can be found. According to the representation of the drawings, the surface P and its extensions divide the space into two regions, a bottom one wherein there are the means 6, the other, the top one where the body 2 is situated. This body 2 is not introduced into the device or system Dx but is merely applied against the surface P.

This device Dx is capable of creating a transverse gradient in relation to the direction Oz of the static field H0 on the side of the plane P where there is the body 2 to be investigated.

According to the representation of FIG. 1, the plane P is horizontal; axis Ox is vertical, directed towards the top, whilst axis Oy is orthogonal to the plane xOz. In this plane xOz, the variation of the vectors B of the magnetic field created along the Ox axis by the device Dx has been schematically illustrated. The magnetic field gradient intensity along the Ox direction created by Dx, corresponds to the slope of the line 5 in relation to the Ox axis. This line 5 passes through the ends of vectors B whose origin is situated on the Ox axis. A zero gradient would correspond to a line 5 parallel to Ox. The device Dx is arranged so that this line 5 should be a straight line or a substantially straight line in the volume to be investigated situated near the point 0. The higher the gradient, that is to say, the steeper the slope of line 5 in relation to the Ox axis, the better the power or resolution along the Ox direction considered.

The means 6 are constituted by a coil comprising two windings 7, 8 symmetrical with respect to each other in relation to the plane xOy orthogonal to the direction of the static field H0. The two windings 7, 8 are connected in series. In an alternative arrangement, they could be connected in parallel.

The winding 7 comprises two groups 7a, 7b of turn arcs situated in a plane orthogonal to the direction of the static field H0. The groups 7a, 7b are separated from each other along the Oz direction by a mean distance l. With the aim of simplification, only two turn arcs 9, 10 have been represented for the group 7a and another two arcs 11, 12 for the group 7b. It is clear that the number of turn arcs can be much greater that two. In one example of the embodiment, provision is made for 49 turn arcs for each group such as 7a, 7b.

The turn arcs are connected by wires (electric conductors) such as 13, 14, 15 parallel to the direction of the static field H0 and situated near the plane P.

More precisely, according to the representation of FIG. 1, the end of the turn arc 11 situated behind the plane xOz is connected to an electric power supply source 16 by means of a connecting wire 17 provided with a connector 18. The end of this turn 11 situated in front of the plane xOz is connected by the wire 13 to the turn 9 also situated in front of the plane xOz. The other end of the arc 9 is connected by the wire 15 to the end of the arc 12 situated behind the plane xOz.

The end of the arc 12 situated in front of the plane xOz is connected by the wire 14 to the end of the arc 10, also situated in front of the plane xOz. The other end of this arc 10 is connected by a wire 19 parallel to the direction Oz to the other winding 8. It is clear that the turn arcs as well as the adjacent wires represented as interspaced from each other in FIG. 1, to facilitate reading of the drawing, can be contiguous whilst being electrically insulated from each other.

The winding 8 also comprises two turn arc groups 8a, 8b symmetrical with respect to groups 7a, 7b in relation to the plane xOy. These groups comprise the same number of turn arcs as the groups 7a, 7b, that is to say, two arcs 20, 21 and 22, 23 respectively according to the simplified example of the drawings. As has already been explained with reference to the winding 7, this number can be much greater than two and in one example of the embodiment, provision is made for forty nine turn arcs for each group 8a, 8b.

The end of the arc 23, situated behind the plane xOz, is connected to the wire 19; the other end of this arc 23, situated in front of the plane xOz is connected by a wire 24 situated near the plane p, to one end of the arc 20. The other end of this arc situated behind the plane xOz is connected by a wire 25 to the end of the arc 22 also situated behind the plane xOz. The other end of this arc 22 is connected by a wire 26 to the front end of the arc 21. The other end of the arc 21 is connected to a wire 27 which is extended by a part 28 forming a conductor for the connection to the other terminal of the source 16. The conductor 28 is provided with a connection means formed by a connector 29.

The plane xOz is a plane of symmetry for the windings 7 and 8. According to FIG. 1, it will be seen that each winding 7, 8 has substantially the shape of a "horse saddle", the gradient coil 6 being formed by the set of two "house saddles" 7, 8.

Each winding 7, 8 could be formed by a number of turn arc groups exceeding two, being in particular, equal to three; the turn arc groups are separated from each other along the direction Oz.

A possible direction of circulation of the electric current in the arcs and wires is represented in FIG. 1 by means of arrows.

Within one and the same winding 7 or 8, the current circulates in the same direction as regards the turn arcs of one and the same group, and in the opposite direction of one group such as 7a, to the other such as 7b. The current circulates in the same direction as regards the adjacent wires such as 13, 14, and in the opposite direction for the interspaced wires, such as 13 and 15.

From one winding 7 to the other 8, the same direction of circulation will be re-encountred in the turn arc groups, for instance, 7b and 8b, symmetrical in relation to xOz. The directions of circulation are opposite in the wires such as 15, 19 and 25, 27 symmetrical in relation to this plane xOz.

The distance between the median plane of the group 7b (or 8b) and the point O is designated by z1, whilst the distance between the group 7a (or 8a) and the same point O is designated by z2.

g designates the center of a turn arc, the arc 9 in the case of FIG. 1 and $\theta$ the half angle of opening of this arc. This half angle is the same for all the arcs of the two windings 7 and 8.

The distance z1, z2 and the half angle of opening are determined so as to maximize the term $\partial Bz/\partial x$ in the expansion in series of the intensity of the field B created by the device Dx.

In one example of the embodiment, $\theta$ was equal to $\pi/2$; because of this, the centers such as g of the turn arcs were situated in the plane P. Designating the radius of the turn arc by r, a good compromise between the requirements of gradient intensity and linearity is obtained with $z1=0.56r$ and $z2=1.5r$.

In this solution, the turn arcs are placed on a half cylinder.

Other solutions are possible with $\theta=\rho/2$ for different z1 and z2 values. It is also possible to have a value for $\theta$ which is different from $\pi/2$.

The detection means R comprise a flat reception coil 30, centered on the point O whose median plane is parallel to the plane P and is situated near this plane, on the same side as the coil 6. The ends of this coil 30 are connected by connecting conductors 31, 32 provided with connection means 33, 34 such as connectors, to means 35 capable of analyzing the signals received and forming an image. These means 35 comprise in particular a spectrometer.

The apparatus 1 comprises means 36 for producing a translation or shifting of the frequency of the analysing spectrometer of the means 35, during the reception of the NMR signal, with a view to correcting a frequency displacement of the spectrometer during the reception of the nuclear magnetic resonance signals due to the field B0 (see FIG. 1) created by the gradient coil 6 at the center O, that is to say, at the level of the reception coil 30. These means 36 can be constituted by a series of special instructions sent to the analyzer means 35 to effect the desired frequency translation.

The device Dx comprises a supporting plate 37 of an elongate rectangular shape made of a material not producing any, or few, nuclear magnetic resonance signals. This plate 37 can be made of a plastic material, in particular a translucent plastic material.

The large dimension of the plate 37 is situated parallel to the direction Oz of the static field H0.

As may more readily be seen in FIG. 2, the windings 7 and 8 of the coil 6 are fixed under the plate 37 (according to the representation of this Figure). The wires such as 13, 14, 15 may be bonded under the plate 37 or be embedded in the material of this plate. The arcs 9, 10 . . . extend perpendicular to the plane of the plate 37 below this latter.

The upper face of the plate 37 constitutes the surface P. In the example represented in the drawings, the plate 37 is flat. As explained above, this plate could have a different shape and have in particular a concave upper surface.

The reception coil 30 is situated beneath the surface P, on the same side as the coil 6 in relation to P. The coil 30 is advantageously fixed below the plate 37, for instance in a circular cut out provided in the thickness of the plate and opening only towards the bottom. The device Dx thus forms an independent sub-assembly which can be easily connected or disconnected by connection means 18, 29 and 33, 34. Provision is made for means, not shown, for holding the plate 37 so that the upper surface should be in a plane passing through the geometrical axis of the coils 4 creating the static field H0.

The observation space corresponds substantially to an imaginary hemisphere 38 (FIG. 2) centered on the point O and situated on the opposite side to the coil 6.

For observing the body to be examined, it suffices after the device Dx has been correctly positioned in the set of coils 4, to apply the portion of the body 2 to be examined, to the central zone of the plate 37 where the detection coil 30 is located. It is clear that the access to this zone is facilitated because the field gradient coil 6 is located on the opposite side of the plate 37 and leaves the access to the upper surface of this plate 37 entirely free.

The relatively small dimensions of the turn arcs of the coil 6 allow the magnetic energy stored by the coil 6 to be minimized and to obtain low switching times (times for setting up the magnetic field gradient), generally less than or equal to 100 microseconds, which makes it possible to study materials or tissues whose relaxation time T2 under NMR is a few milliseconds.

Good linearity of the gradient is ensured in the observation space 38.

The characteristics of an example of the embodiment are given below.

Intensity of the field gradient in terms of the current intensity: 50 G/m (Gauss/meter) per ampere.

Field B0 created at the center O by the device Dx: 0.3 G

Diameter of the circle to which the arcs 9, 10 . . . appertain: 0.12 m

With such characteristics, the observation space 38 corresponds to that of a hemisphere whose radius is approximately 14 mm. The linearity of the gradient in the complete sphere is good, being of the order of 3% (a perfect linearity corresponding to 0%).

For a gradient equal to 220 G/m, and a switching time of 70 microseconds, the power necessary for switching is only 350 watts.

The frequency translation $\Delta f$ of the spectrometer actuated by the means 36, during the observation time of the signal, is of the order of 230 Hz per gauss/meter, to effect compensation for the field B0.

The advantages of the proposed device may be summed up as follows:

access of the body or of the specimen to be examined to the observation zone is easy because of the unilateral disposition of the coil 6 in relation to the plane P;

the device is small in size and forms a sub-assembly comprising the gradient coil 6 and the reception coil 30;

good linearity is obtained in the variation of the field intensity within the observation space, whose radius is approximately 14 mm;

the switching time is short, which is suitable for rapid imaging, a low power requirement for obtaining a high gradient.

Such a Dx device is suitable for surface imaging, in particular for in vivo imaging of the skin of the human body. The short gradient switching time makes it possible to use very short sequences with a maximum gradient intensity. It has been possible to reduce the resolution power for examining human skin to 100 $\mu$m (micrometers) in one example of the embodiment in accordance with the invention.

The application of such a device to fast imaging is also worthwhile.

We claim:
1. An apparatus for the examination of a body by nuclear magnetic resonance comprising:
   means for creating a main homogeneous static magnetic field, oriented along a determined direction, into which static field the body to be examined is to be placed;
   means for creating magnetic field gradients in a volume of the body to be examined;
   radio frequency excitation means; and
   means for detecting the nuclear magnetic resonance signals produced by the body to be examined, at least one of the said means for creating magnetic field gradients comprising a unilateral system for creating a magnetic field gradient along a direction in space, said apparatus including a member having an open surface having a first side and an opposite, second side for receiving thereon the body to be examined with said unilateral system being disposed entirely on said first side of said surface, said gradient creating means being capable of creating at least one gradient which is transverse in relation to the direction of the main static magnetic field, on the first side of said surface, said means for creating said magnetic field gradient being constituted by a coil including at least two windings which are symmetrical with respect to each other relative to a plane extending orthogonal to the direction of said main static magnetic field, each said winding comprising at least two turn arcs situated in a plane orthogonal to the direction of the main static magnetic field and interspaced from each other along said direction and being connected by wires.
2. The apparatus as claimed in claim 1, wherein said wires are connected in series.
3. An apparatus according to claim 1, wherein each said turn arc situated in a plane orthogonal to the direc- tion of the static field has a half angle of opening chosen to maximize the term $\partial Bz/\partial x$ in the expansion of the field created by the turn arc.

4. An apparatus according to claim 3, wherein the half angle of opening is equal to $\pi/2$.

5. An apparatus according to claim 1, wherein said wires are situated in the vicinity of said surface.

6. An apparatus according to claim 2, 3 or 4, wherein said detection means comprises a flat reception coil disposed in a plane parallel to the direction of the said main static field on said first side of said surface.

7. An apparatus according to claim 6, wherein said reception coil is situated in particular at the center of said means for creating the field gradient.

8. An apparatus according to claim 1 or 2, wherein said means for creating the magnetic field gradient includes a coil and said means for detecting the nuclear magnetic resonance signals produced by the body to be examined and a spectrometer for analyzing the frequencies received by the reception coil is provided, said apparatus comprising means for producing a translation of the frequency of said spectrometer during the reception of the nuclear magnetic resonance signals to correct a frequency displacement due to the field created by said gradient coil in the vicinity of said reception coil.

9. Apparatus as claimed in claim 1 or 2, wherein said member is a supporting plate on which is fixed on said one side the gradient coil and a flat reception coil of the detector means with electric connection means being provided to connect the gradient coil and the reception coil, said supporting plate being made of a material that produces few or no nuclear magnetic resonance signals.

10. Apparatus according to claim 1, wherein said member is made of a plastic material.

11. Apparatus according to claim 9, including a reception coil fixed on said member on said first side thereof.

12. Apparatus according to claim 9, wherein the gradient coil comprises two windings which are symmetrical with respect to each other in relation to a plane orthogonal to said plate and to its longer axis, said two windings being able to be connected in series or in parallel.

13. Apparatus according to claim 12, wherein each winding comprises at least two turn arcs or groups of turn arcs situated in a plane orthogonal to the direction of the longer axis of the plate and interspaced from each other along this direction, said longer axis being intended to be placed parallel to the direction of a main static field, and said turn arcs being connected by conductors which are parallel to the direction of the longer axis of the plate.

14. Apparatus according to claim 13, wherein each turn arc has a half angle of opening chosen to maximize the term $\partial Bx/\partial x$ in the expansion of the field created by this turn arc.

* * * * *